United States Patent [19]
Variot et al.

[11] Patent Number: 5,557,150
[45] Date of Patent: * Sep. 17, 1996

[54] OVERMOLDED SEMICONDUCTOR PACKAGE

[75] Inventors: Patrick Variot, San Jose; Chok J. Chia, Campbell, both of Calif.

[73] Assignee: LSI Logic Corporation, Milpitas, Calif.

[ * ] Notice: The term of this patent shall not extend beyond the expiration date of Pat. No. 5,262,927.

[21] Appl. No.: 429,605

[22] Filed: Apr. 27, 1995

Related U.S. Application Data

[62] Division of Ser. No. 331,263, Oct. 28, 1994, which is a continuation of Ser. No. 969,862, Oct. 28, 1992, abandoned, which is a continuation-in-part of Ser. No. 917,894, Jul. 21, 1992, abandoned, and a continuation-in-part of Ser. No. 834,182, Feb. 7, 1992, Pat. No. 5,262,927.

[51] Int. Cl.⁶ .................................................. H01L 23/28
[52] U.S. Cl. .................................... 257/787; 257/666
[58] Field of Search ............................ 257/787, 666, 257/668

[56] References Cited

U.S. PATENT DOCUMENTS

| | | | |
|---|---|---|---|
| 5,136,366 | 8/1992 | Worp et al. | 257/787 |
| 5,255,157 | 10/1993 | Hegel | 257/787 |
| 5,262,927 | 11/1993 | Chia et al. | 257/787 |
| 5,355,283 | 10/1994 | Marrs et al. | 257/787 |

FOREIGN PATENT DOCUMENTS

| | | | |
|---|---|---|---|
| 1-106449 | 4/1989 | Japan | 257/787 |
| 1-191457 | 8/1989 | Japan | 257/787 |
| 2-205055 | 8/1990 | Japan | 257/787 |
| 3-116856 | 5/1991 | Japan | 257/787 |

*Primary Examiner*—Sara W. Crane
*Assistant Examiner*—S. V. Clark
*Attorney, Agent, or Firm*—Katz & Cotton, LLP

[57] ABSTRACT

A technique for providing partially and fully overmolded semiconductor packages is described which prevents delamination (detachment) of the molding compound from the substrate by allowing the molding compound to flow through holes in the substrate and forming it into rivet-like anchors on the opposite side of the substrate. Various shapes of rivet-like anchors are described. Different embodiments provide for the formation of molded standoffs and locating pins integral to the anchor structures.

6 Claims, 7 Drawing Sheets

OVERMOLDED SEMICONDUCTOR PACKAGE

CROSS-REFERENCE TO RELATED APPLICATIONS

This application is a divisional of commonly-owned U.S. patent application Ser. No. 08/331,263, filed Oct. 28, 1994; which was a file wrapper continuation of U.S. patent application Ser. No. 07/969,862, filed Oct. 28, 1992 (now abandoned); which was a continuation-in-part of U.S. patent application Ser. No. 07/917,894, filed Jul. 21, 1992 (now abandoned), and a continuation-in-part of U.S. patent application Ser. No. 07/834,182, filed Feb. 7, 1992 (now U.S. Pat. No. 5,262,927, issued Nov. 16, 1993.

TECHNICAL FIELD OF THE INVENTION

The invention relates to the packaging of integrated circuit (IC) semiconductor devices (chips), especially to high pin count packages formed by injection or transfer molding.

BACKGROUND OF THE INVENTION

In order to handle and connect a semiconductor die (integrated circuit device) to external systems, it is generally necessary to package the die. This usually involves mounting the die to some sort of substrate, leadframe or carrier, connecting bond pads on the die to some sort of conductive lines or traces and forming a package body around the die. The conductive lines or traces exit the package body, and usually terminate in external leads or pins.

For example, ceramic packages have a package body with a central opening (cavity) in one face for receiving the die, and lead fingers embedded in the body and extending into the opening. The die is connected (usually wire bonded) to the exposed (in the opening) portions of the lead fingers. The lead fingers are connected (internally in the package) to pins exiting a planar surface of the package. These pins are typically arranged in a rectangular (e.g., square) array. This type of packaging is expensive, and involves several elements for the ceramic package, not the least of which is the pins. In some instances, the die-receiving cavity is "up", on one face of the package body, and the pins are on the other, opposite face of the package body. In other instances, the die-receiving cavity is "down", on the same face of the package as the pins (in which case there are no pins in the area of the cavity). (The pins are deemed to be on the "bottom" of the ceramic body.)

In another example, the die is attached and connected (usually wire bonded) to a relatively rigid (thick) lead frame having several conductive lines, and a plastic body is molded around the die and inner ends of the conductive lead frame lines. Outer ends of the lead frame lines exit the plastic body on two or four sides. The leads may be closely spaced and delicate, demanding extreme care in handling to avoid lead skew and the like. Co-planarity (more correctly, lack thereof) is a problem with this, or any type of leaded (having external leads) package.

In another example, the die is attached to a relatively flexible (thin) lead frame supported by a plastic tape, and is encapsulated in epoxy or the like. Outer ends of the lead frame lines exit the epoxy body. These leads are even more fragile than those of plastic packages. Both wire bonding and tape-automated bonding of the die to the lead frame lines are well known in tape packages.

Another packaging technique is mounting the die directly to a printed circuit board (PCB; also referred to as PWB, or printed wiring board) substrate. The die is connected (typically wire bonded) to one end of conductive traces on a face (surface) of the PCB. Another end of the trace is connected to a pin, a separate external lead, or the like.

A recent development in semiconductor packaging is exemplified by Motorola's "OMPAC", or Overmolded Plastic Pad Array Carrier, whereby a semiconductor die is mounted face-up in a central area of a printed circuit board (PCB). The PCB is larger than the die. The top surface of the PCB is provided with a number of conductive traces that extend from near the periphery of the PCB to the central area. The die has bond pads on its face. Bond wires extend from these bond pads to inner ends of the traces. Near the periphery of the PCB, there are plated (conductive) through-holes (vias) extending from the back side of the PCB, through the PCB to a respective trace. The back side of the PCB is provided with a number of conductive traces, each having an end connected with a respective via. In this manner, signals (and power) to and from the die are connected through the bond wires, through the top side traces, through the vias, to the bottom side traces. A plastic molded body is formed over the die, and partially covers the top surface of the PCB.

Such "partial" coverage of the PCB by the molding compound results in a package body that can delaminate (separate) from the substrate (PCB) when the molded body shrinks after molding. Consequently, moisture can penetrate onto the chip along the delamination interface (plane between molded body and PCB) and cause reliability failures. The adhesion of the partially molded plastic body on to the substrate is generally considered as the weak link in this type of package, and is especially so when the plastic molded body gets large and the substrate is thin and flexible.

Further, in order to perform this type of "partial" molding, non-conventional molding equipment is required. The gate for injecting the mold compound cannot be at the parting line of the mold. The mold will thus have a cavity plate that needs to be removed from the mold press to unload the package. (The mold would be a three-part design with a cavity plate section that has to be removed from the mold to remove the completed package.)

Molding an entire package body over a die mounted to a leadframe ("fully molded") usually requires that the leadframe has a "dambar", namely a continuous ring of metal surrounding the body that prevents the plastic from flowing out of the mold cavity between the external leads of the leadframe. The dambar then has to be removed to isolate individual leads before the package is usable. With high pin count packages, the leads are often delicate and spaced closely (fine pitch), resulting in the need for very fine precision tooling for the trimming operation. This type of tooling is also very expensive, which adds to the overall cost of packaging.

Molding of plastic (or other suitable encapsulant) around the leadframe also causes some leakage of the plastic onto the leadframe (flashing). The flash then has to be removed in a separate de-flashing (dejunking) step.

Attention is directed to commonly-owned U.S. Pat. No. 5,051,813, entitled PLASTIC-PACKAGED SEMICONDUCTOR DEVICE HAVING LEAD SUPPORT AND ALIGNMENT STRUCTURE, which discloses plastic packaging with and without dambars, dejunking, etc.

In the main, hereinafter, molding where the mold gate is disposed at the parting plane of the two mold halves is discussed, as most pertinent to the present invention.

The following U.S. Pat. Nos. are cited of general interest in the field of packaging (annotations in parentheses): 3,405, 441 (hermetic sealing process using glass and metal lid on a ceramic substrate); 3,909,838 (package formed by sealing two halves or pre-molded body around a molded pill package bonded to a leadframe); 4,143,456 (glob top sealing devices mounted on a substrate); 4,264,917 (silicon substrate with glob top encapsulation); 4,300,153 (TAB device with a substrate bonded to the bottom of the die; glob top encapsulation); 4,330,790 (tape-mounted device encapsulated using a metal carrier and epoxy); 4,363,076 (flat TAB assembly); 4,507,675 (molded heatsink package); 4,594,770 (bonding a metal cap and a plastic cap around a leadframe); 4,857,483 (mold gate is not located at the parting plane of the mold halves); 4,872,825 (encapsulation method using a lamination process instead of injection or transfer molding); 4,874,722 (pre-molded flatpack encapsulated with silicone gel; dambar required; not encapsulated by molding); 4,890, 152 (molded pin grid array package; not a surface mount flatpack construction); 4,913,930 (coating and encapsulating a device in a reel-to-reel format); 4,955,132 (flip chip mounting to a substrate); 4,961,105 (die back metallization); 4,974,057 (die coated with resin and then molded); 4,975, 765 (high density flatpack with edge connectors; not a molded package); 4,982,265 (stackable TAB); 4,984,059 (leadframe tips overlap the top of the die surface); 4,996,587 (thin,stackable package); and 5,025,114 (leadframe construction resulting in multilayer structure for plastic packages).

DISCLOSURE OF THE INVENTION

It is therefore an object of the present invention to provide an improved molded packaging technique.

It is a further object of the present invention to provide an improved technique for overmolding a semiconductor die on a substrate.

It is another object of the present invention to provide a molded packaging technique that is relatively inexpensive and relatively easy to manufacture, and reliable.

It is another object of the present invention to provide a technique for overmolding a semiconductor die on a substrate that prevents de-lamination (detachment) of the molding material (encapsulant) from the substrate.

It is another object of the present invention to provide a technique for overmolding a semiconductor die on a substrate that produces locating pins as a part of the molding process.

It is another object of the present invention to provide a technique for overmolding a semiconductor die on a substrate that produces standoffs (spacers) as a part of the molding process.

According to the invention, an overmolded semiconductor package comprises a substantially planar substrate, a semiconductor die mounted to the top surface of the substrate, one or more holes disposed through the substrate, and molding compound disposed over the top surface of the substrate, covering the semiconductor die and extending through the one or more holes therethrough, thereby forming rivet-like anchors on the bottom surface of the substrate.

The anchors draw the molding compound on the top surface of the substrate firmly to the substrate, preventing detachment therefrom.

In one embodiment of the invention, the molding compound extends only partially over the top surface of the substrate.

In another embodiment of the invention, the molding compound extends completely over the top surface of the substrate.

In another embodiment of the invention, slits are disposed in the molding compound, extending towards the top surface of the substrate. The slits provide for some flexibility of the molding compound (after curing) so that the molding compounds can conform to some flexing of the substrate without cracking or delaminating (detaching).

In one variation of this embodiment, the slits extend partially through the molding compound towards the top surface of the substrate. Another variation permits the slits to extend completely through the molding compound, partially exposing a portion of the top surface of the substrate underlying the molding compound.

In another embodiment of the invention, one or more tapered holes are provided through the substrate, each having a dimension at the bottom surface of the substrate greater than its corresponding dimension at the top surface of the substrate, and one or more rivet-like anchors are formed at the bottom surface of the substrate through tapered holes by the molding compound.

In one variation of this embodiment, the rivet-like anchors formed through the tapered holes are molded flush with the bottom surface of the substrate.

The invention additionally provides for molded structures on the bottom surface other than rivet-like anchors. These structures are formed in the same manner by allowing the molding compound to flow through holes in the substrate, then forming it on the other side of the substrate.

In one such embodiment, at least one molded structure formed on the bottom surface of the substrate includes a rivet-like anchor.

In another embodiment, at least one molded structure formed on the bottom surface of the substrate includes a locating pin.

Other embodiments provide for molded structures formed into standoffs and combination standoff/locating pins.

In another embodiment, a plurality of molded structures include locating pins arranged in a pattern, where the pattern of the locating pins is adapted to enforce a particular orientation of the package when inserted into a set of corresponding holes formed in a printed circuit board.

The present invention can also accommodate leadframe structures. This embodiment of the invention provides a substantially planar first substrate and a substantially planar second substrate having a centrally located opening. A leadframe is sandwiched between the bottom surface of the first substrate and the top surface of the second substrate, such that the leads of the leadframe extend outward beyond the two substrates. A semiconductor die is attached to the bottom surface of the first substrate through the opening in the second substrate, and one or more holes extend through the first and second substrate from the top surface of the first substrate to the bottom surface of the second substrate. An overmolded "cover" (package body) is formed from molding compound disposed over the semiconductor die, completely filling the opening, partially covering the bottom surface of the second substrate, and extending through the one or more holes to the top surface of the first substrate, where one or more molded structures are formed.

Various embodiments provide for similar molded structures and arrangements to those described hereinabove.

Other objects, features and advantages of the invention will become apparent in light of the following description thereof.

DETAILED DESCRIPTION OF THE INVENTION

Figure 1:
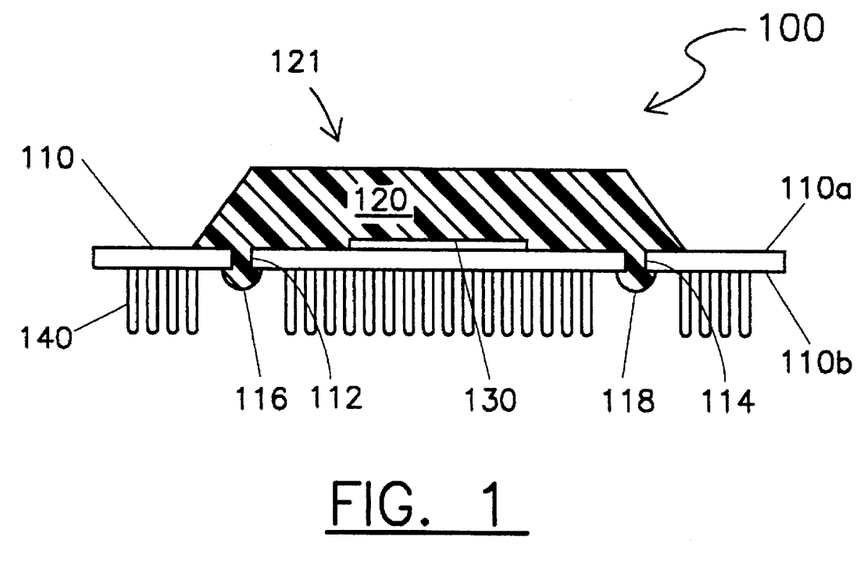
FIG. 1 is a cross-sectional view of a first embodiment of the over-molded package of the present invention.

FIG. 1 shows a partially over-molded package 100, according to the present invention. A semiconductor die 130 is mounted to an upward-facing (as viewed in FIG. 1) surface 110a of a substantially planar substrate 110. Holes (or slits) 112 and 114 are provided through the substrate, as shown in the Figure. Pins 140 are disposed in an array on a downward-facing surface 110b of substrate 110. It will be understood by one of ordinary skill in the art that conductive traces extending from the pins 140 towards the die 130 provide electrical connection points by which electrical connections may be established between the die 130 and the pins 140 (typically by bond wires, solder bumps, or other suitable connection technique).

A molding compound 120 (preferably plastic, moldable epoxy, or other similar suitable material) is formed into a "cover" or overmolded package body 121 over the die 130 in an overmolding process, and extends partially over the upward-facing surface of the substrate 110, such that a small amount of molding compound 120 flows through the holes (or slits) 112 and 115, forming integral (with the package body 121) rivet-like anchors 116 and 118. Preferably, depressions are provided in a mold cavity coincident with the holes (or slits) 112 and 114 which form the shapes of the rivet-like anchors 116 and 118 during the overmolding process. These rivet-like anchors, when cured, firmly secure the overmolded package 121 to the upward-facing surface 110a of the substrate 110, effectively limiting the ability of the molding compound 120 to delaminate (detach) from the substrate 110.

While the rivet-like anchors 116 and 118 are shown as having a generally rounded shape, these are merely exemplary of a suitable shape. The invention places no specific requirement on the shape of the rivet-like anchors.

In general, the molding process is the same for all embodiments of the present invention. A mold cavity with two halves is provided. The top half forms the shape of the overmolded top surface while the bottom half has depressions which form the shapes of the rivet-like anchors.

Figure 2:
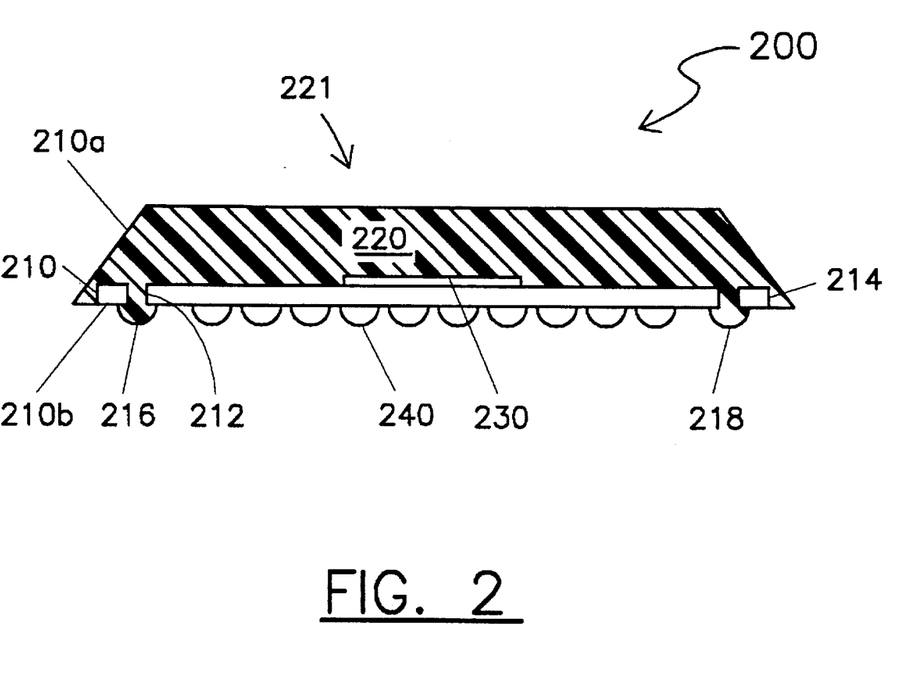
FIG. 2 is a cross-sectional view of a second embodiment of the over-molded package of the present invention.

FIG. 2 shows a fully over-molded package 200, according to the invention. In much the same manner as that shown with respect to FIG. 1, a semiconductor die 230 is mounted to an upward-facing surface 210a of a substrate 210, forming electrical connections (not shown) with an array of ball bump contacts 240, disposed on a downward-facing surface 210b of substrate 210. Holes 212 and 214 extend through the substrate 210. A molding compound 220 is formed into an overmolded package body 221, completely covering the die 230 and the upward-facing surface 210a of substrate 210, and at least partially around the ends of the substrate 210. In a manner similar to that shown with respect to FIG. 1, an amount of molding compound 220 flows through holes 212 and 214 to form rivet-like anchors 216 and 218. These rivet-like anchors secure the overmolded package body 221 to the upward-facing surface 210a of substrate 210 preventing delamination (detachment) therefrom.

In this embodiment, the rivet-like anchors 216 and 218 may be formed such that during subsequent assembly of the package 200 to a circuit board they act as spacers therebetween, thereby providing a minimum distance to facilitate the formation of reliable bump contacts of a pre-determined mechanical structure.

It will be readily appreciated by one of ordinary skill in the art that the rivet like anchors (e.g., 116 and 118 with respect to FIG. 1, or 216 and 218 with respect to FIG. 2) may be disposed either within or without the array of pins (140, FIG. 1) or bump contacts (240, FIG. 2). FIG. 1 shows rivet like anchors 116 and 116 disposed within the array of pins 140, and FIG. 2 shows rivet-like anchors disposed without (outside of) the array of bump contacts 240. According to the present invention, any of the features shown with respect to FIGS. 1 and 2 may be interchanged, i.e., an embodiment of the invention may be fully overmolded or partially overmolded; may have an array of pin-type contact, bump contacts, or any other suitable electrical connections; and may have rivet like anchors disposed within (inside of) or without (outside of) the array of electrical connections (e.g., pins, bump contacts, etc.).

Figure 3A:
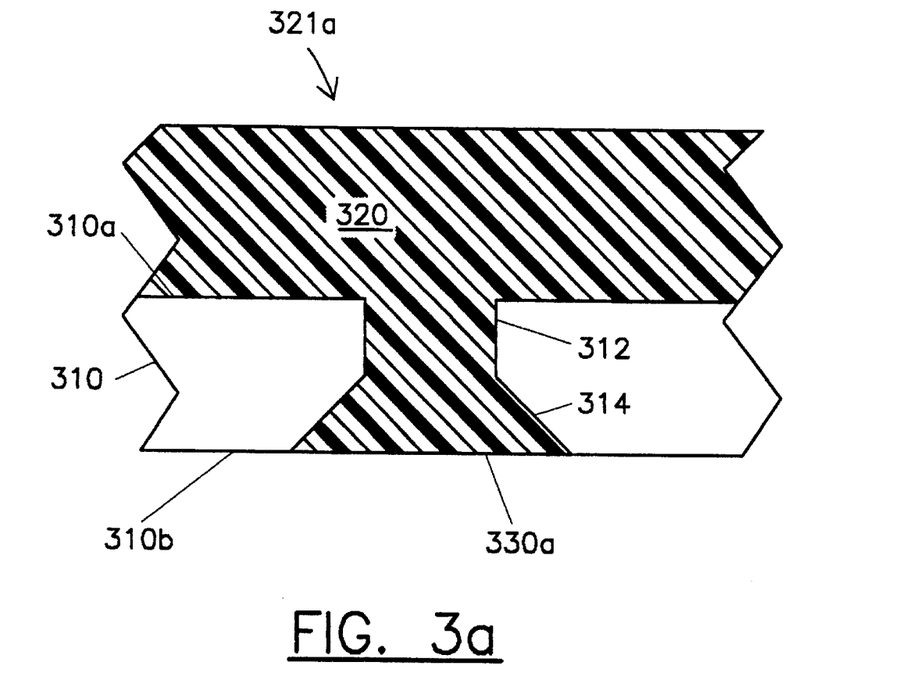
FIG. 3a is a cross-sectional view of one embodiment of a flush rivet-like anchor according to the present invention.
Figure 3B:
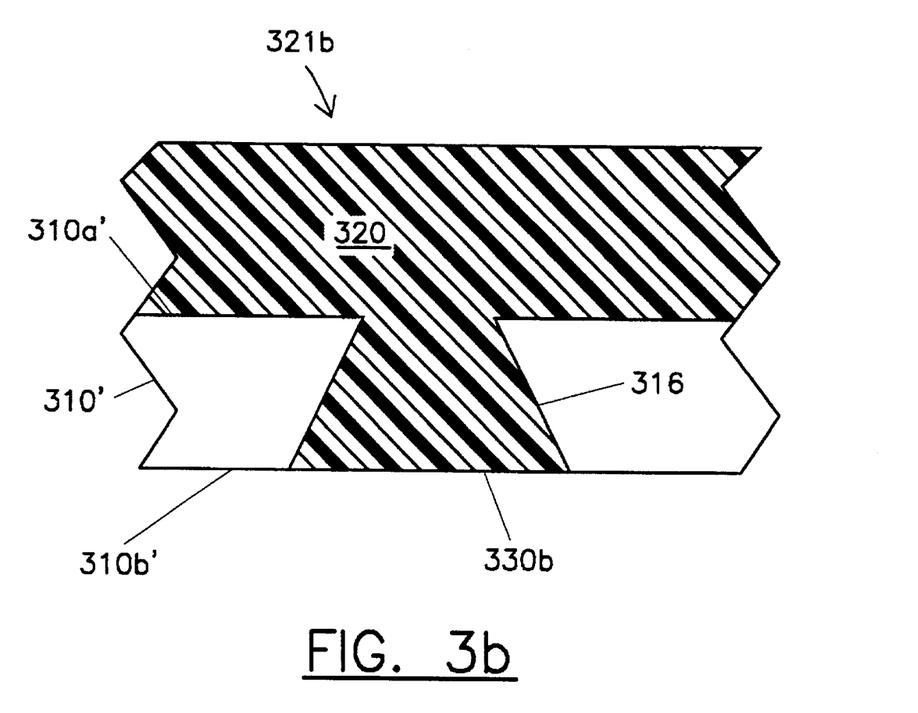
FIG. 3b is a cross-sectional view of another embodiment of a flush rivet-like anchor according to the present invention.

In FIGS. 3a and 3b, and in the following discussion with respect thereto, pins, bumps, and other electrical connections have been omitted for illustrative clarity.

FIG. 3a is a cross-sectional view of a substrate 310, an upward facing surface 310a of which is over-molded by a molding compound 320 forming an overmolded package body 321a, whereby a flush, integral, rivet-like anchor 330a is formed in a manner similar to that described hereinabove with respect to FIGS. 1 and 2. A hole 312 (analogous to the holes 112 and 212 described hereinabove with respect to FIGS. 1 and 2) through the substrate has a flared portion (chamfered edge) on a downward facing side 310b of the substrate 310. During the molding process, the molding compound 320 is permitted to flow into the hole 312, but is prevented from flowing out past the downward-facing side of the substrate 310 (by a flush surface on the corresponding part of the mold cavity). The flush, integral, rivet-like anchor 330a thus formed similarly assists in preventing delamination (detachment) of the molding compound 320 from the substrate 310, without extending out of the downward facing surface 310b of the substrate 310.

FIG. 3b shows and embodiment similar in most regards to that shown with respect to FIG. 3a. In this embodiment, a substrate 310' is overmolded with a molding compound 320 to form an overmolded package body 321b on an upward facing surface 310a' of the substrate 310', simultaneously forming a flush, integral, rivet-like anchor 330b in a manner similar to that described with respect to FIG. 3a, except that the flush rivet-like anchor 330b is formed in a tapered hole 316 (analogous to the holes 112, 212 described hereinabove with respect to FIGS. 1 and 2), rather than in a straight hole with a flared portion. The tapered hole 316 has walls which flare outward towards the downward facing surface 310b' of substrate 310'.

It will be appreciated by one of ordinary skill in the art that any opening through the substrate which has a dimension on the downward-facing surface of the substrate greater than its dimension on the upward-facing surface of the substrate is suitable for the formation of a flush rivet-like anchor.

In general, holes provided through a substrate material, as illustrated with respect to FIGS. 1, 2, 3a and 3b, permit the formation of rivet-like anchors when overmolded with a suitable molding compound. However, it is also possible to form the molding compound which flows through the substrate into additional useful structures by providing different shapes in the bottom mold cavity. These are discussed hereinbelow with respect to FIGS. 4a–4e and FIG. 5. As in FIGS. 3a,3b, pins/bump contacts are omitted in FIGS. 4a–e and 5 for illustrative clarity.

Figure 4A:
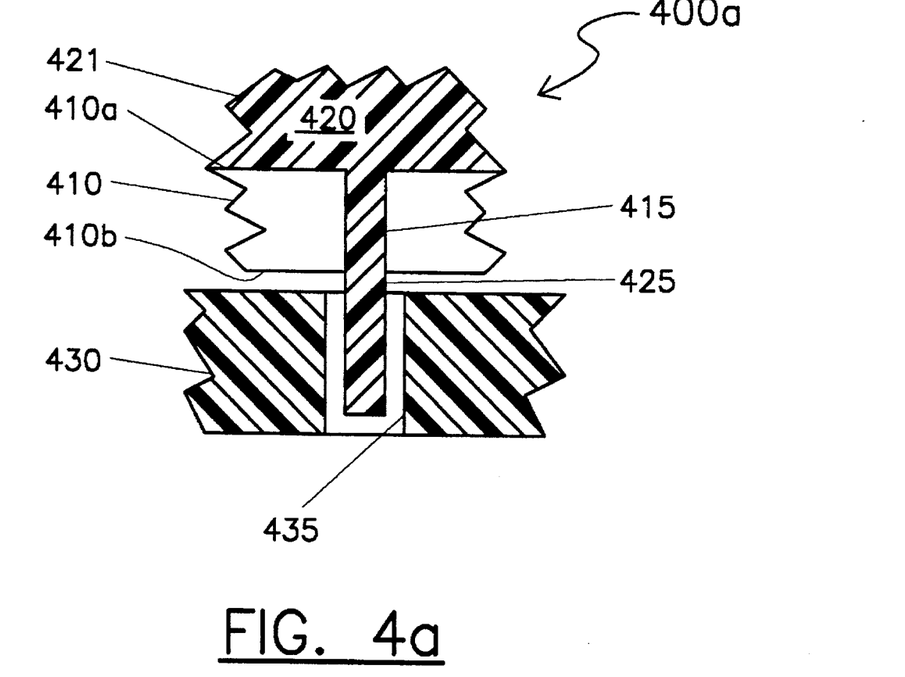
FIGS. 4a–4e are cross-sectional views of various embodiments of molded locating pins, molded rivet-like anchors, molded standoffs, and combinations thereof.

FIG. 4a is a cross-sectional view of a portion of an overmolded package 400a. A top surface 410a of a substrate 410 is overmolded by a molding compound 420 such that the molding compound 420 flows through a hole 415 in the substrate 410 and is formed into a locating pin 425 on the downward facing side (surface) 410b of the substrate 410. This pin 425 extends into a hole 435 in a printed circuit board 430, to which the package 400a is assembled, providing a positioning reference therewith.

Figure 4B:
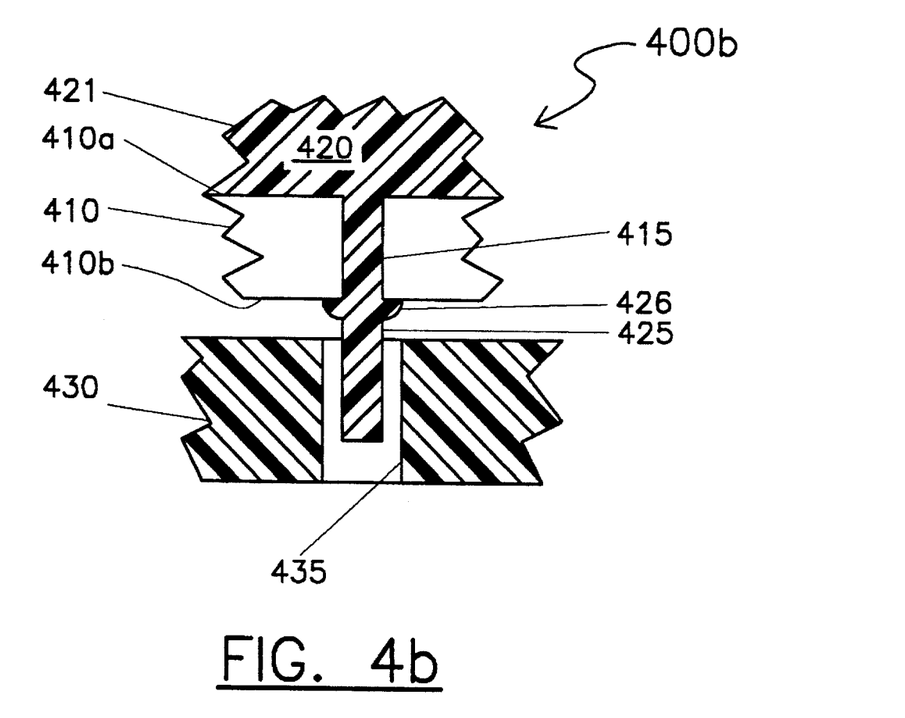

FIG. 4b is a cross-sectional view of a portion of another overmolded package 400b, similar to the overmolded package 400a of FIG. 4a, except that a rivet-like anchor 426 is additionally formed on the downward-facing side 410b of the substrate 410. Package 400b is similarly assembled to the printed circuit board 430, using locating pin 425 as a positioning reference therewith.

Figure 4C:
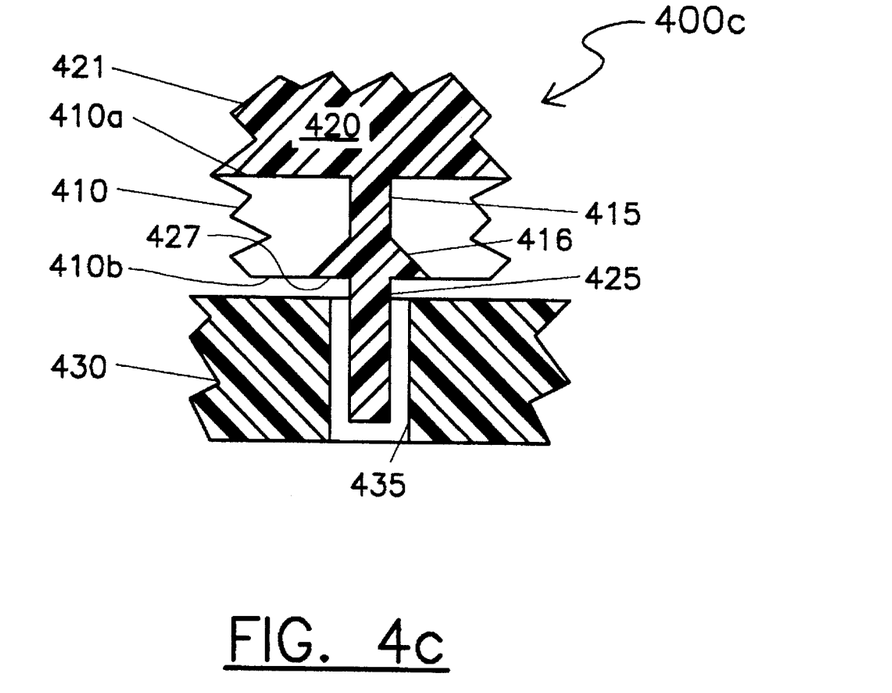

FIG. 4c is a cross-section view of a portion of another embodiment of an overmolded package 400c, similar to the embodiment 400a described with respect to FIG. 4a. This time, the hole 415 through the substrate 410 has a tapered (chamfered) portion 416 (see FIG. 3a for comparison). The molding compound is formed on the downward-facing surface 410b of the substrate 410 such that locating pin 425 extends from a flush rivet-like anchor formed in the tapered portion of hole 415. As before, the locating pin 425 extends into hole 435, providing a positioning reference between the package 400c and the printed circuit board 435.

Figure 4D:
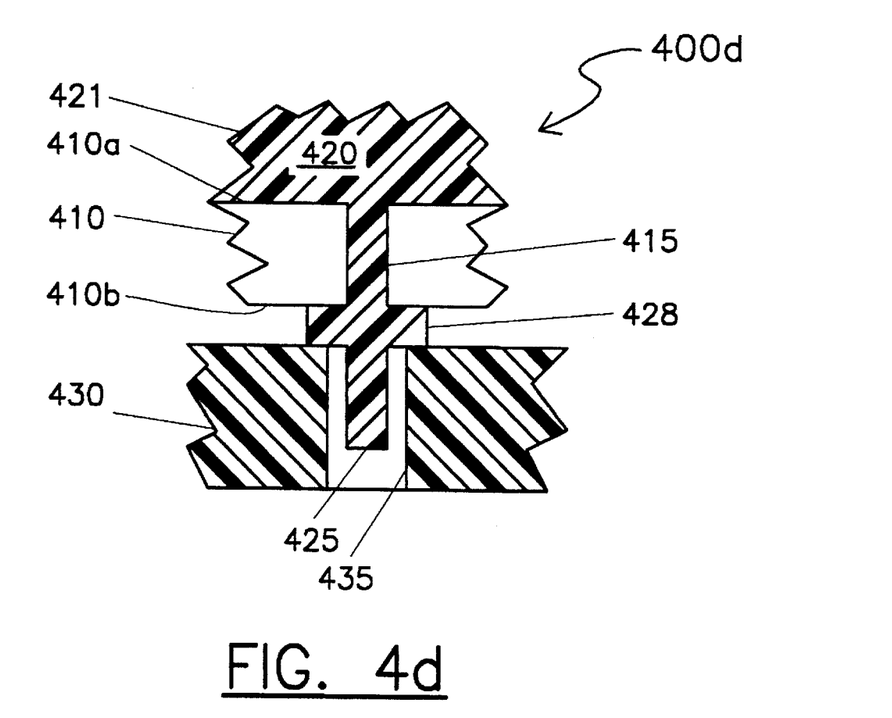

FIG. 4d is a cross-sectional view of a portion of another embodiment of an overmolded package 400d, similar to the embodiment described with respect to FIG. 4b. In this embodiment, however, instead of forming a rivet-like anchor 426, an integral rivet/standoff structure 428 is formed, from which locating pin 425 extends. The rivet/standoff structure 428 is sized such that it is greater than the width of the hole 435 and rests on one surface of the printed circuit board 430 when assembled thereto. Locating pin 425 still provides a positioning reference, but the rivet/standoff structure 428 provides a minimum gap between the circuit board 430 and the package 400d.

Figure 4E:
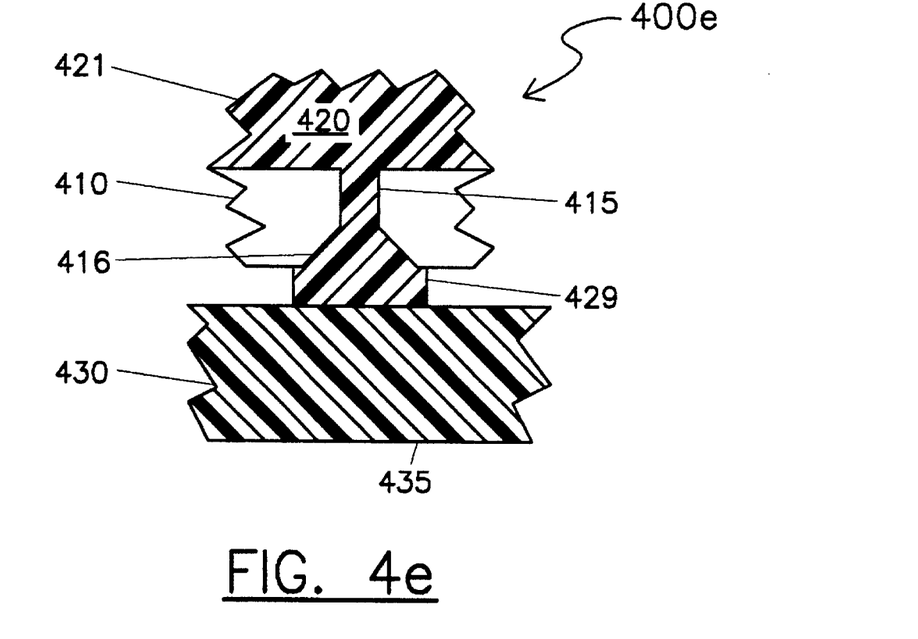

FIG. 4e is a cross-sectional view of still another embodiment of an overmolded package 400e combining features of the packages described with respect to FIG. 4c and 4d. In this embodiment, a tapered portion 416 of hole 415 is provided, and a rivet/standoff structure 429 is formed, this time without a locating pin (e.g., 425). When the package 400e is assembled to the circuit board 430, rivet/standoff structure 429 rests directly on the surface of the circuit 430, providing a minimum spacing between the package 400e and the circuit board 430. In this case, the molded rivet/standoff structure 429 has no locating pin extending therefrom, and is simply used as a spacer.

It will be readily appreciated by one of ordinary skill in the art that the tapered portion 416 of hole 415 is not an essential part of the embodiment described with respect to FIG. 4e, which may also be implemented without such a tapered portion 416. However, FIG. 4e demonstrates that the various features of the present invention may be used alone or in combination. Further, where a plurality of molded structures such as those described with respect to FIGS. 4a–4e are formed on a single package, they may be mixed, such as is described hereinbelow with respect to FIG. 5.

Figure 5:
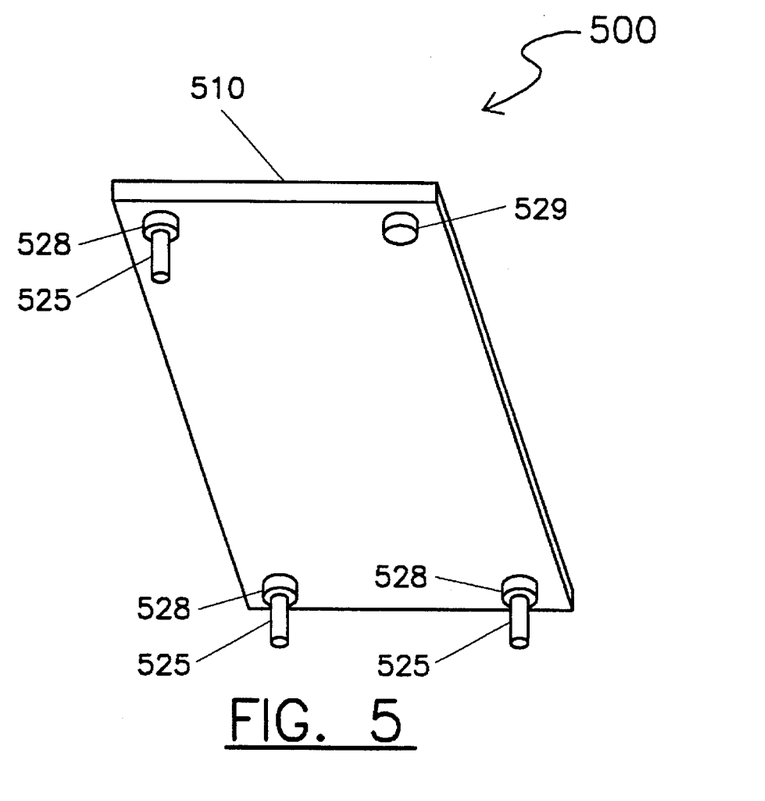
FIG. 5 is a view of the bottom side of a semiconductor package illustrating the use of locating pins for keying, according to the present invention.

FIG. 5 shows an overmolded package 500 of the type described hereinabove, where the top surface of a substrate 510 has been partially or fully overmolded, forming a plurality of molded structures on the bottom surface of the substrate 510. At three corners of the bottom surface of the substrate 510, molded rivet/standoff structures 528 (see 428, FIG. 4d) are formed from which locating pins 525 (comparable to locating pin 425 with respect to FIG. 4a–d) extend. In a fourth corner, a rivet/standoff structure 529 (see 429, FIG. 4e) is formed. The pattern formed by the three locating pins 525 may be used to "key" the package 500 to a printed circuit board, while the rivet/standoff structure 529 and the integral standoffs 527 help to stabilize the package and provide proper spacing between the package 500 and the circuit board. That is, the pattern of the locating pins 525 is such that they force a particular orientation of the package when inserted into corresponding holes in the printed circuit board.

It will be readily appreciated by one of ordinary skill in the art that several minor variations on this scheme are possible. For example, FIG. 5 shows through a "missing pin" approach (i.e., all of the molded structures are similar, but one has no locating pin). Of course, any combination or number of standoff/locating pins and standoffs may be used. Another variation on this theme varies the shape or size of one or more of the locating pins, for example, using a number of small locating pins and one large locating pin. A similarly sized and positioned set of locating holes in a circuit board effect the keying of the package to the circuit board. Another variation on this theme uses one or more differently shaped pins. For example, a triangular-shaped pin (and a mating triangular shaped hole on the circuit board) may be used to effect the keying of the package to the circuit board. Other shapes such as squares, rectangles, other polygonal shapes, half-circles, pie sections, etc., are equally effective.

While the various rivet-like anchors and combination structures described hereinabove provide for better retention of the molding compound, it is often necessary to provide for some additional flexibility of the molding compound for larger packages. This is accomplished by molding slits into the molding compound (on the "die side" of the substrate) to permit some flexing of the molding compound without cracking thereof. This is described hereinbelow with respect to FIG. 6a and 6b.

Figure 6A:
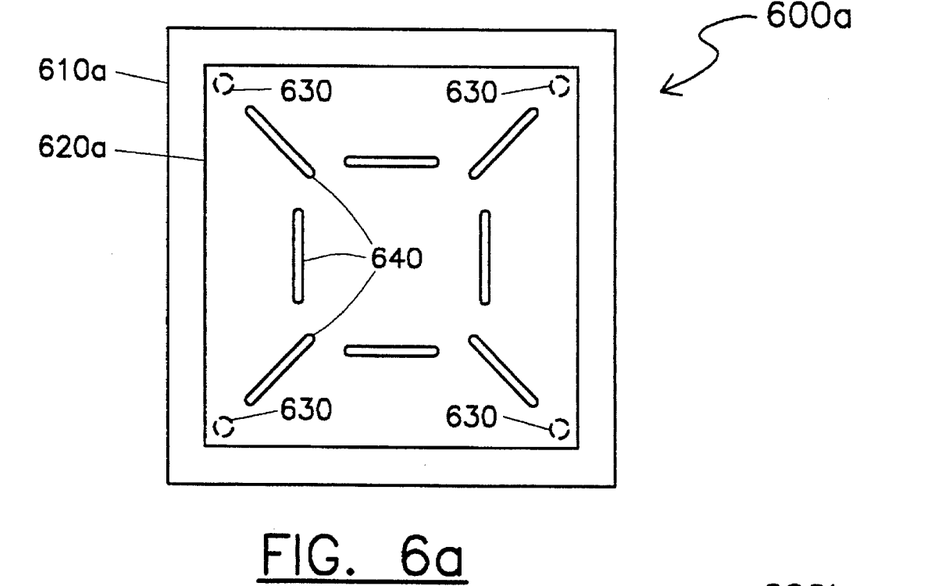
FIGS. 6a and 6b are top views of two embodiments of molded packages, according to the invention, illustrating the use of molded slits.

FIG. 6a is a top view of a partially overmolded package 600a according to the present invention. A substrate 610a is partially overmolded with a molding compound 620a extending partially over the top surface of the substrate 610a, and forming rivet-like anchors 630 on the bottom surface of the substrate 610a by means describe hereinabove. A plurality of molded-in slits 640 (three indicated) extending in a number of different directions provide for limited flexibility of the molding compound (after curing) such that some bending of the substrate 610a may be accommodated without cracking or delamination of the molding compound 620a. The slits 640 may extend either partially or completely through the molding compound 620a. If they extend completely through the molding compound 620a, then the top surface of the substrate 610a is exposed.

Figure 6B:
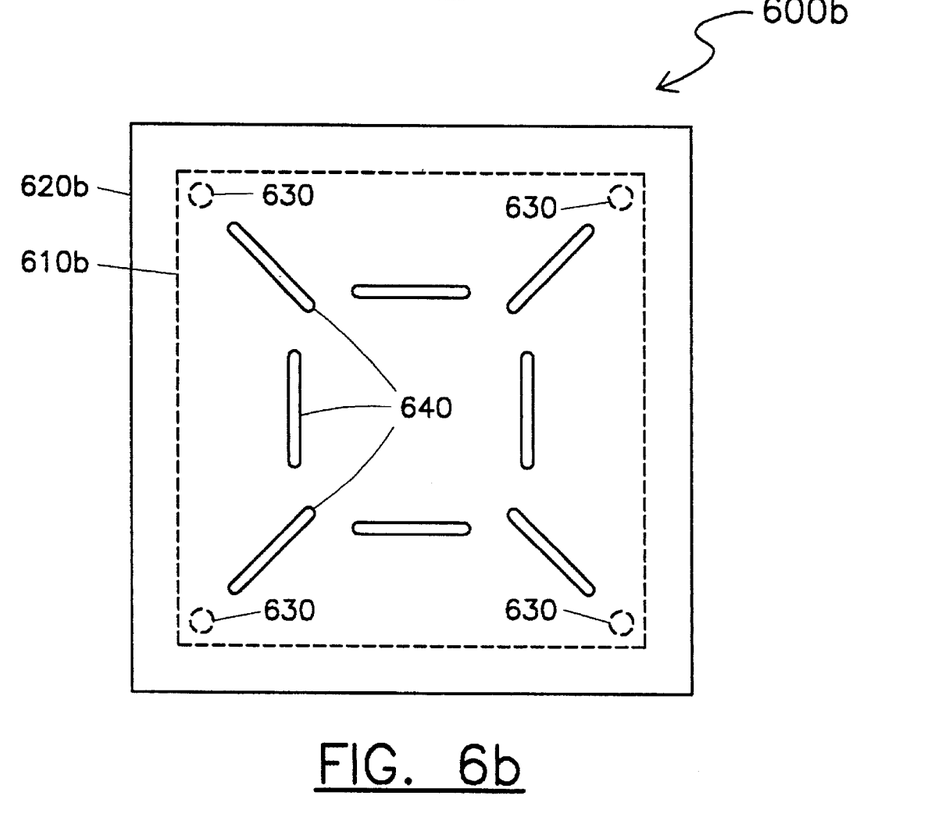

FIG. 6b is a top view of a fully overmolded package 600b, identical in all respects to the partially overmolded package 600a except that substrate 610b is fully overmolded by molding compound 620b. Rivet-like anchors 630 and molded-in slits 640 are similarly formed and perform similarly.

The foregoing embodiments of the present invention have been directed to planar substrates upon which (printed) conductive traces are disposed. It is also possible, however, to apply the techniques of the present invention to leadframe-type assemblies, as described hereinbelow with respect to FIG. 7.

Figure 7:
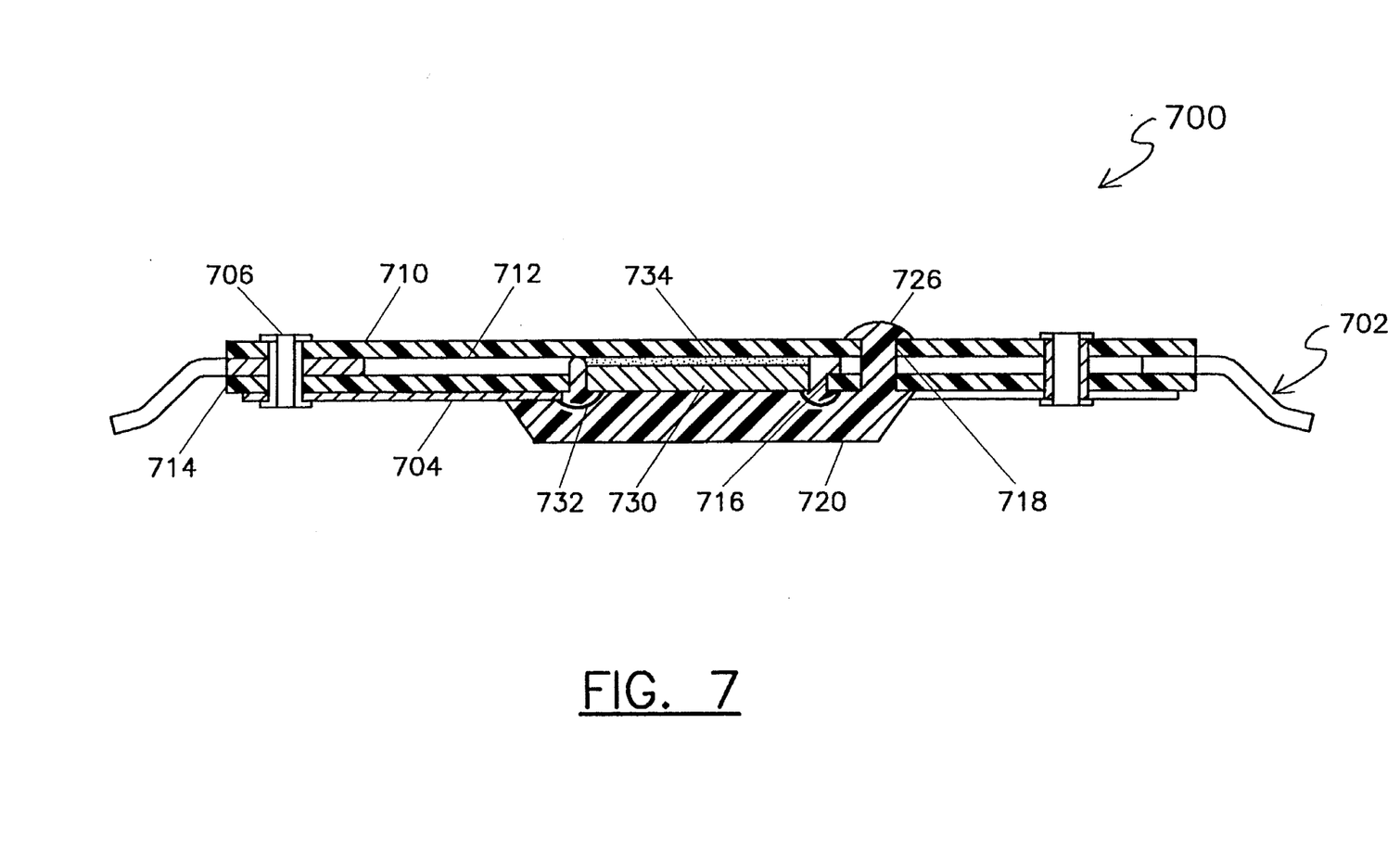
FIG. 7 is a cross-sectional view of an alternate embodiment of a molded package, according to the invention.

FIG. 7 shows an alternate embodiment 700 of a partially-molded form of the present invention. In this embodiment, an upper PCB (or substrate) 710 is formed as a simple planar substrate element, without conductive lines (traces). A sandwich structure is formed around a leadframe by upper PCB 710 and a lower PCB 714. Lower PCB 714 has an opening 716 adapted to receive a semiconductor die 730, which is mounted directly to the underside 712 of the upper PCB 710. Leads 702 of the leadframe extend inward towards the opening 716. Holes 718 (one shown) are provided completely through upper PCB 710 and lower PCB 714.

Whereas the upper PCB 710 does not have conductive lines, the lower PCB is provided with a wiring layer of conductors (traces) 704. These conductors 704 each extend from a respective through hole 706 towards the inner periphery of the lower PCB, preferably to within 0.010 inches of the opening 716 so as to be adjacent the die 730. The conductors 704 are electrically connected to the through holes 706. A preferred method of making this connection is simply plating the through holes 706. In essence, the through holes 706 are simply formed as plated through vias, a well known technique. Inner ends of the conductors 704 are left exposed, for connecting to the die 730 via bond wires 732. The remaining, outward portions of the conductors 704 are preferably coated with solder mask material, for purposes of electrical insulation.

A molded plastic (or epoxy, or other suitable material) encapsulant 720 is formed over the die 730 and a portion of lower PCB 714, completely covering opening 716, bond wires 732 and the inner ends of the conductors 704. The molding process is performed such that a small amount of encapsulant 720 flows through holes 718 (one shown) forming rivet-like anchors 726 (one shown). As in the other embodiments, the rivet-like anchors 726 tend to prevent delamination of the encapsulant.

Generally, this embodiment provides many of the same advantages and benefits as the previous embodiments.

What is claimed is:

1. An overmolded semiconductor package, comprising:

a sandwich structure of a leadframe disposed between an upper substrate and a lower substrate;

a semiconductor die mounted within an opening in the lower substrate and connected to wiring traces disposed on the lower substrate;

means for selectively electrically connecting the wiring traces to leads of the leadframe;

at least one hole extending through the upper and lower substrates; and a plastic molded structure disposed over the die and partially over the lower substrate, and extending through the at least one hole of the upper and lower substrates.

2. An overmolded semiconductor package according to claim 1, wherein:

at least a portion of the plastic molded structure includes locating pins arranged in a pattern; and the pattern of the locating pins is adapted to enforce a particular orientation of the package when inserted into a set of corresponding holes formed in a printed circuit board.

3. An overmolded semiconductor package according to claim 1, wherein the molded structure includes a rivet-like anchor.

4. An overmolded semiconductor package according to claim 1, wherein the molded structure includes a standoff.

5. An overmolded semiconductor package according to claim 1, wherein the molded structure includes a locating pin.

6. An overmolded semiconductor package according to claim 1, wherein the molded structure includes a standoff with locating pin extending therefrom.

* * * * *